United States Patent
Shim et al.

(10) Patent No.: US 7,301,173 B2
(45) Date of Patent: Nov. 27, 2007

(54) GROUP III-NITRIDE LIGHT EMITTING DEVICE

(75) Inventors: Hyun Wook Shim, Kyungki-do (KR); Suk Kil Yoon, Kyungki-do (KR); Joong Seo Kang, Kyungki-do (KR); Jong Hak Won, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 153 days.

(21) Appl. No.: 11/313,967

(22) Filed: Dec. 22, 2005

(65) Prior Publication Data

US 2006/0219999 A1    Oct. 5, 2006

(30) Foreign Application Priority Data

Mar. 30, 2005    (KR) ............... 10-2005-0026736

(51) Int. Cl.
*H01L 27/15*    (2006.01)

(52) U.S. Cl. .......................... 257/79; 257/77

(58) Field of Classification Search ............... 257/79, 257/96, 13, 77
See application file for complete search history.

(56) References Cited

U.S. PATENT DOCUMENTS 6,593,597 B2    7/2003    Sheu
6,720,570 B2 *  4/2004    Lee et al. ............... 257/14

FOREIGN PATENT DOCUMENTS

JP    10-135514    5/1998

* cited by examiner

*Primary Examiner*—Mark V. Prenty
(74) *Attorney, Agent, or Firm*—McDermott Will & Emery LLP

(57) ABSTRACT

The present invention provides a group III-nitride light emitting device improved in operating voltage and electrostatic discharge characteristics. The group III-nitride light emitting device comprises a lower n-type clad layer, a current spreading layer, an upper n-type clad layer, an active layer and an p-type clad layer formed in their order on a substrate. The current spreading layer includes a SiC layer.

16 Claims, 3 Drawing Sheets

GROUP III-NITRIDE LIGHT EMITTING DEVICE

RELATED APPLICATION

This application claims the benefit of Korean Patent Application No. 2005-0026736 filed on Mar. 30, 2005, in the Korean Intellectual Property Office, the disclosure of which is incorporated herein by reference.

BACKGROUND OF THE INVENTION

1. Field of the Invention

The present invention relates to a group III-nitride light emitting device. More particularly, the present invention relates to a group III-nitride light emitting device such as a group III-nitride light emitting diode (LED) or a laser diode improved in operating voltage and electrostatic discharge characteristics.

2. Description of the Related Art

A device using a group III-nitride semiconductor is utilized in many areas such as light emitting devices including light emitting diodes (LEDs) and laser diodes (LDs) or light-receiving devices such as solar cell and optical censor. The device is also employed in electronic devices such as a transistor and a power device. The group III-nitride semiconductor is a compound semiconductor having a composition expressed by $Al_xGa_yIn_{1-x-y}N$, where $0 \leq x \leq 1$, $0 \leq y \leq 1$ and $0 \leq x+y \leq 1$. The LED and LD devices using such material are essential for the development of various light sources such as a natural-color sign board, a traffic signal, a light source of image scanner, and a high-density optical recording medium.

FIG. 1 is a sectional view illustrating a group III-nitride light emitting device (especially LED device). Referring to FIG. 1, a conventional light emitting device 10 includes an undoped GaN layer 13, an n-type clad layer 14 made of n-doped $Al_xGa_yIn_{1-x-y}N$, an active layer 16 and a p-type clad layer 18 made of p-doped $Al_xGa_yIn_{1-x-y}N$. An n-electrode 24 is formed on a surface of the n-type clad layer 14 exposed by mesa etching, and a transparent electrode layer 20 and a p-type electrode 22 made of ITO are formed on the p-type GaN-based clad layer 18. Japanese Laid-Open Patent Application No. 10-135514 discloses an active layer of a multiple quantum well structure that has an undoped GaN barrier layer and an undoped InGaN well layer in order to enhance light emitting efficiency and brightness.

However, in order to use the LED device 10 described above as lighting source and outdoor display, output power should be enhanced more and operating voltage (Vf) should be lowered further to reduce heat generation and improve reliability and useful life of the device. Also, to utilize the LD device as stable light source for optical pickup or DVD, it is necessary to upgrade the LD device significantly and lengthen its useful life through reduction in operating voltage.

In addition to operating voltage problem as identified above, electrostatic discharge (ESD) is caused by a person or a machine handling or using the LED or LD. Extensive studies have been conducted to increase ESD resistance in order to prevent damage to the LED or LE by ESD, and various solutions have been proposed. For example, optical device such as the LED or LD can be connected in parallel to a separate zener diode, or an ESD protection diode is mounted on a single substrate in manufacturing of the LED (refer to U.S. Pat. No. 6,593,597). But these methods require purchasing or assembling of a separate protective device besides the LED (or LD) or providing a protective LED via a separate process, therefore complicating a manufacturing process and increasing costs.

SUMMARY OF THE INVENTION

The present invention has been made to solve the foregoing problems of the prior art and it is therefore an object of the present invention to provide a group III nitride light emitting device capable of enhancing light output and lowering operating voltage.

It is another object of the invention to provide a group III-nitride light emitting device capable of achieving high ESD resistance without a need for other devices to increase ESD resistance.

According to an aspect of the invention for realizing the object, there is provided a group III-nitride light emitting device comprising: a lower n-type clad layer, a current spreading layer and an upper n-type clad layer formed in their order on a substrate; and an active layer and a p-type clad layer formed in their order on the upper n-type clad layer, wherein the current spreading layer comprises a SiC layer.

According to the embodiment of the invention, the SiC layer may comprise an undoped SiC layer. The undoped SiC layer is basically n-type conductive. According to other embodiment, the SiC layer may comprise an n-doped SiC layer. In this case, a dopant added to the SiC layer comprises one selected from a group consisting of N, Ti, Cr and P.

According to the embodiment of the invention, the current spreading layer further comprises high-concentration n-doped $Al_xGa_yIn_{1-x-y}N$ layers having electron concentration higher than that of the lower n-type clad layer, where $0 \leq x \leq 1$, $0 \leq y \leq 1$, and $0 \leq x+y \leq 1$, and formed on and underneath the SiC layer, respectively. Preferably, the high-concentration n-doped $Al_xGa_yIn_{1-x-y}N$ layers have electron concentration of $1 \times 10^{21}$ cm$^{-3}$ or less. Also, the lower n-type clad layer preferably has electron concentration of $1 \times 10^{18}$ to $5 \times 10^{18}$ cm$^{-3}$. The high-concentration n-doped $Al_xGa_yIn_{1-x-y}N$ layer formed on the SiC layer has a composition identical to or different from the high-concentration n-doped $Al_xGa_yIn_{1-x-y}N$ layer formed underneath the SiC layer.

According to one embodiment of the invention, the current spreading layer may further comprise at least one SiC layer on the high-concentration n-doped $Al_xGa_yIn_{1-x-y}N$ layer formed on the SiC layer. For example, the current spreading layer may comprise a multilayer structure including the high-concentration n-doped $Al_xGa_yIn_{1-x-y}N$ layer and the SiC layer stacked repeatedly.

According to the preferred embodiment, the upper n-type clad layer comprises a low-concentration n-doped $Al_xGa_yIn_{1-x-y}N$ layer having electron concentration lower than that of the lower n-type clad layer, and formed just underneath the active layer.

Preferably, the low-concentration n-doped $Al_xGa_yIn_{1-x-y}N$ layer has electron concentration of at least $1 \times 10^{16}$ cm$^{-3}$.

More preferably, the low-concentration n-doped $Al_xGa_yIn_{1-x-y}N$ layer has electron concentration of $1 \times 10^{16}$ cm$^{-3}$ to $1 \times 10^{18}$ cm$^{-3}$.

The group III-nitride light emitting device according to the invention may be a light emitting diode (LED) or a laser diode (LD).

The essential characteristics of the invention is that the current spreading layer including the SiC layer is inserted between the n-clad layers of the group III-nitride light emitting device. The current spreading layer may comprise only the SiC layer in the simplest way. However to attain sufficient ESD protection effects, preferably, the current spreading layer comprises high-concentration n-doped $Al_xGa_yIn_{1-x-y}N$ layers formed on and underneath the SiC layer. According to embodiments, the current spreading layer may comprise a plurality of SiC layers.

In the specification, 'group III-nitride' designates a binary, ternary or quaternary compound semiconductor expressed by $Al_xGa_yIn_{1-x-y}N$, where $0 \leq x \leq 1$, $0 \leq y \leq 1$ and $0 \leq x+y \leq 1$. Also 'group III nitride light emitting device' means that an n-type clad layer, an active layer and a p-type clad layer constituting a light emitting structure are made of group III-nitride. As used herein, the term "high-concentration" means electron concentration higher than that of the lower n-type clad layer. The term "low-concentration" means electron concentration lower than that of the lower n-type clad layer.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
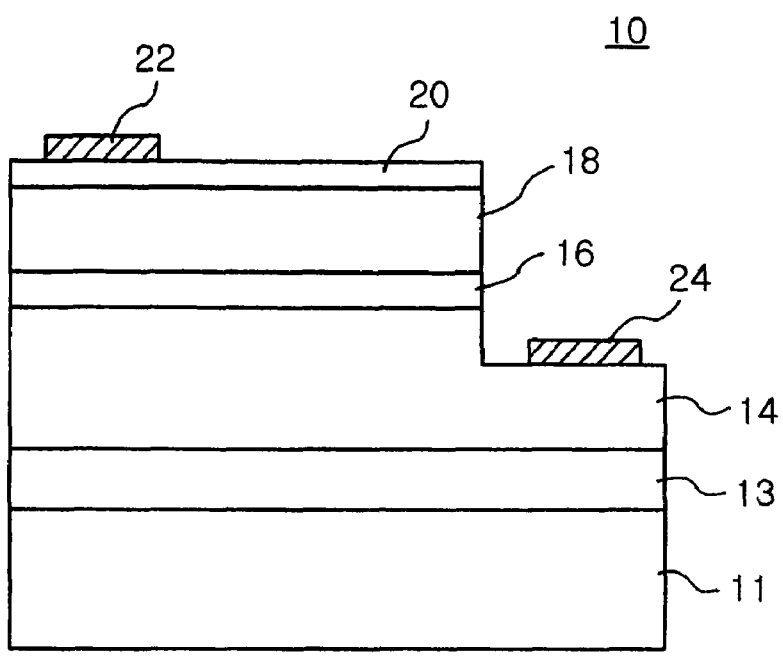
FIG. 1 is a sectional view illustrating an example of a conventional group III-nitride light emitting device.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signals are used to designate the same or similar components throughout.

Figure 2:
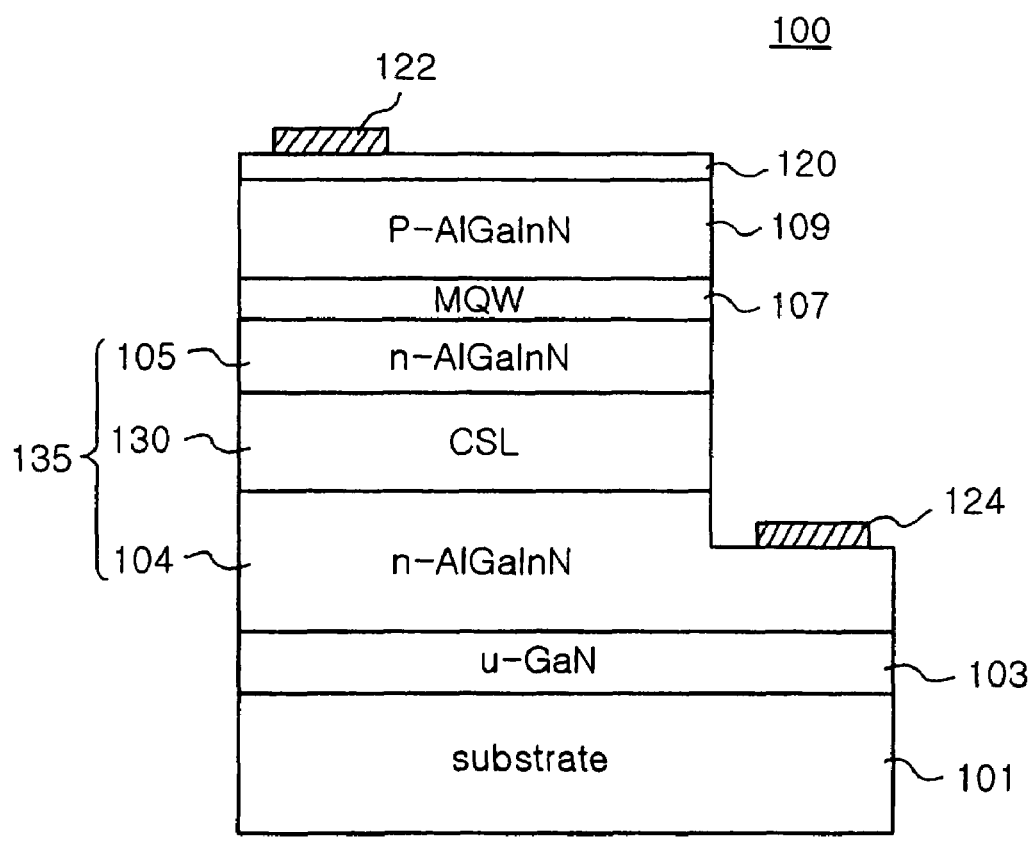
FIG. 2 is a sectional view illustrating a group III-nitride light emitting device according to an embodiment of the invention.

FIG. 2 is a sectional view of a group III-nitride light emitting device according to an embodiment of the invention. Especially, FIG. 2 shows the group III-nitride light emitting device. Referring to FIG. 2, the group III-nitride light emitting device 100 includes an undoped GaN layer 103, a lower n-type clad layer 104 made of n-doped $Al_xGa_yIn_{1-x-y}N$, a current spreading layer (CSL) 130, an upper n-type clad layer 104 made of n-doped $Al_xGa_yIn_{1-x-y}N$ sequentially formed on a sapphire substrate 101. The upper and lower n-type clad layers 105, 104 and the current spreading layer 130 form an n-side area of the light emitting device 100.

An active layer 107 with multiple quantum well structure (MQW), a p-type clad layer 109 made of p-doped $Al_xGa_yIn_{1-x-y}N$ and a transparent electrode layer are formed on the upper n-type clad layer 104. Also, a p-electrode 122 is formed on a surface area of the transparent electrode layer, and an n-electrode 124 is formed on the lower n-type clad layer 104 exposed by mesa etching. According to embodiments, the active layer with single quantum well (SQW) structure may be used.

An essential characteristic of the invention is that the current spreading layer 130 including a SiC layer is interleaved in an n-type clad layer 135 to boost current spreading and ESD resistance. On an interface of the SiC layer included in the current spreading layer 130, 2-dimensional electron gas (2-DEG) layer is formed due to band gap difference. Such 2-DEG layer allows better spreading of current due to its high electron mobility. Further, this current spreading effect reduces operating voltage ($V_f$) and expands light emitting area. Consequently, the current spreading layer 130 leads to improvement in light emitting efficiency and light output.

Figure 4:
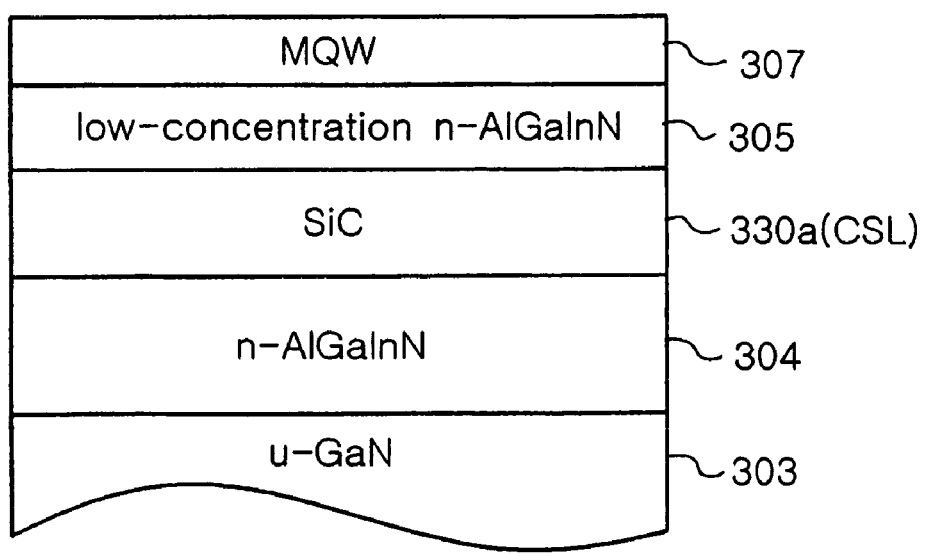
FIG. 4 is a partial sectional view illustrating a current spreading layer of a group III-nitride light emitting device according to an embodiment of the invention.
Figure 5:
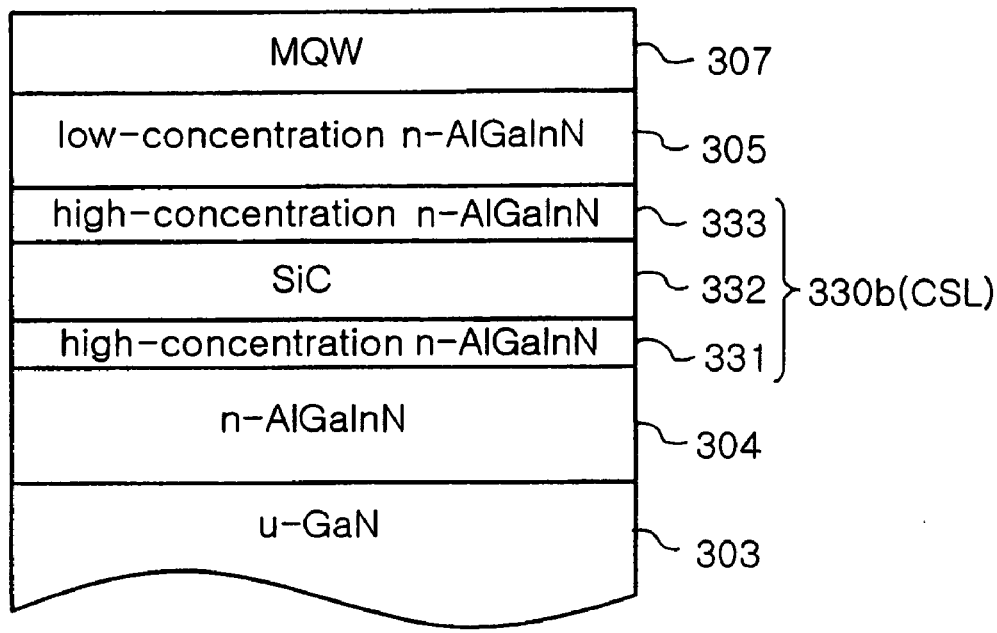
FIG. 5 is a partial sectional view illustrating a current spreading layer of a group III-nitride light emitting device according to another embodiment of the invention.
Figure 6:
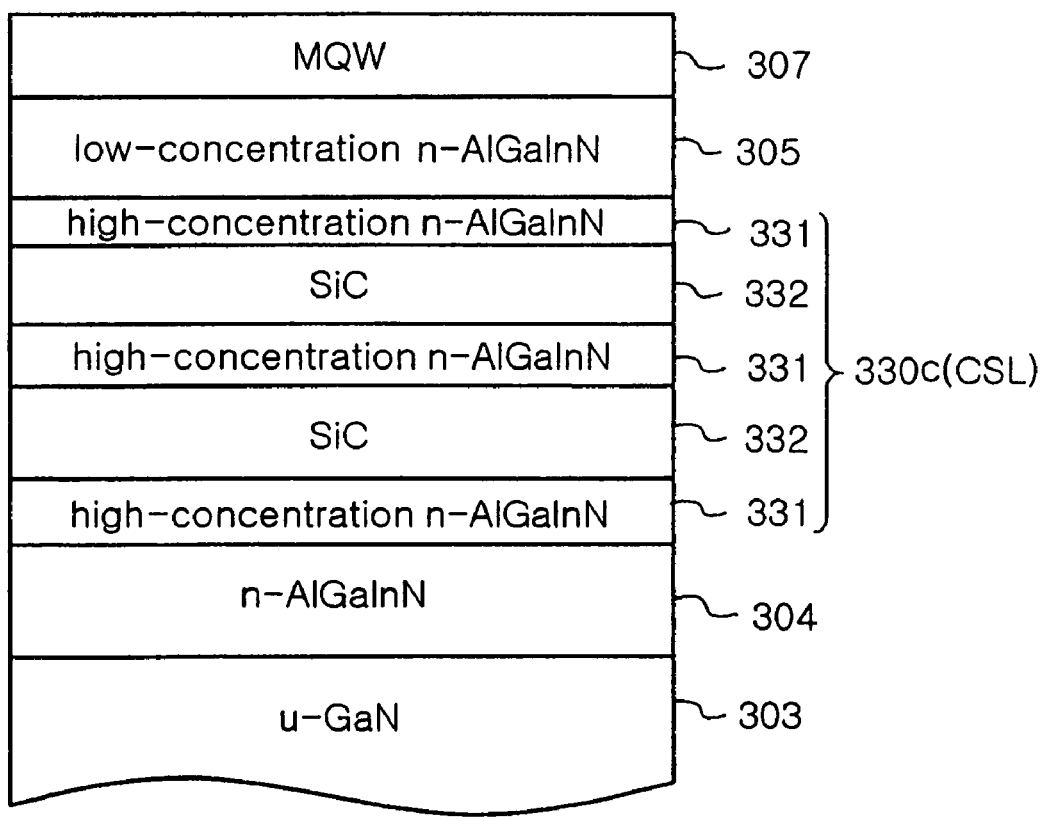
FIG. 6 is a partial sectional view illustrating a current spreading layer of a group III-nitride light emitting device according to further another embodiment of the invention.

In addition, the SiC layer in the current spreading layer 130 exhibits relatively higher dielectric constant compared to adjacent n-doped $Al_xGa_yIn_{(1-x-y)}N$ material, thus serving as a capacitor. As a result, the current spreading layer 130 protects the light emitting device 100 from a sudden voltage surge or static electricity to increase ESD resistance of the light emitting device. Detailed structure of the current spreading layer 130 is shown in FIGS. 4 to 6.

Figure 3:
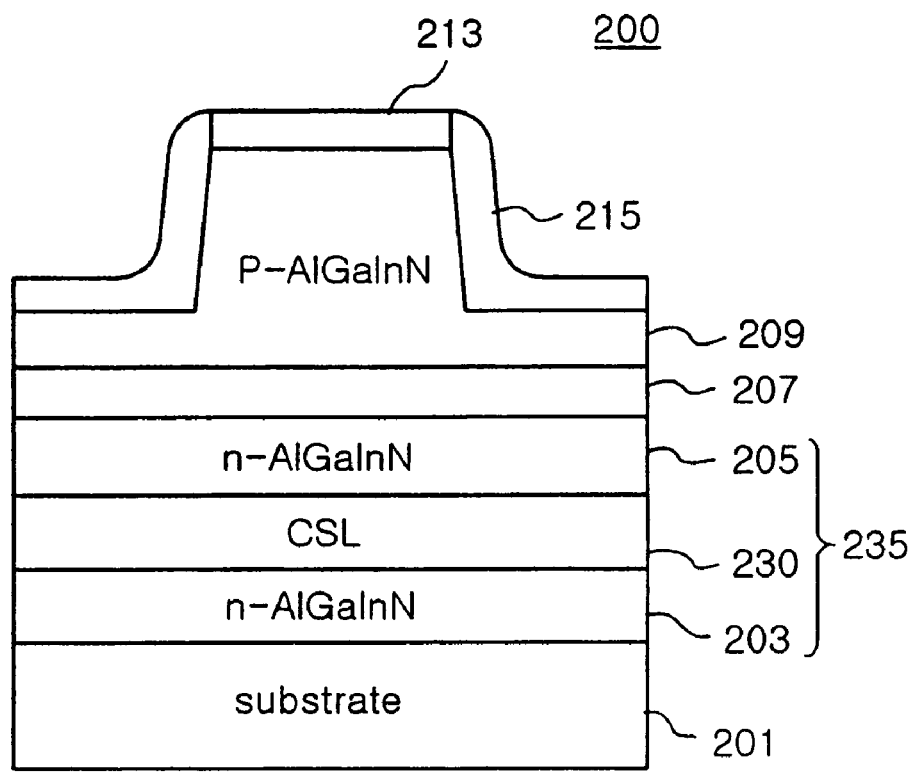
FIG. 3 is a sectional view illustrating a group III-nitride light emitting device according to another embodiment of the invention.

FIG. 3 is a sectional view illustrating a group III-nitride light emitting device according to another embodiment of FIG. 3. Especially, FIG. 3 shows the group III-nitride laser diode (LD). Referring to FIG. 3, the group III-nitride light emitting device 200 includes a lower n-type clad layer 203, a current spreading layer 230, and an upper n-type clad layer 205 sequentially formed on a GaN substrate or a SiC substrate 201. The upper and lower clad layers 205, 203 are made of n-doped $Al_xGa_yIn_{1-x-y}N$, and together with the current spreading layer 230, constitute an n-side area 235.

An active layer 207 and a p-type clad layer 209 are formed on the upper n-type clad layer 205. The p-type clad layer 209 is ridge-structured and made of p-doped $Al_xGa_yIn_{1-x-y}N$. On one side of the ridge, a current blocking layer 215 made of insulating material is formed, and on the p-type clad layer 209, a p-type contact layer 213 is formed. Although not shown in FIG. 3, a p-electrode is formed on the p-type contact layer 213 and an n-electrode is formed on a bottom of a substrate 210.

In the embodiment of the invention, the current spreading layer 230 is interleaved between the n-type clad layers and includes the SiC layer. Therefore, as in the aforesaid embodiment, according to this embodiment, the 2-DEG layer resulting from energy band gap allows current spreading effect, and high dielectric constant of the SiC layer increases ESD resistance of the light emitting device 200. Therefore, the invention is effectively applied to the LED and LD as well.

FIG. 4 is a partial sectional view illustrating a group III-nitride light emitting device according to an embodiment of the invention. Referring to FIG. 4, an upper n-type clad layer 304 made of n-doped $Al_xGa_yIn_{1-x-y}N$ is formed on an undoped GaN layer 303, and a current spreading layer 330a is formed on the upper n-type clad layer 304. Also, an upper n-type clad layer 305 and an active layer 307 with MQW structure are formed on the current spreading layer 330a.

According to the embodiment, the current spreading layer 330a is made of only the SiC layer. The SiC layer has energy band gap smaller than that of n-type clad layers 305, 304 positioned in the upper and lower part thereof. Consequently, on an interface of the SiC layer, a 2-DEG layer, which reportedly has very high electron mobility, is formed. Therefore, in activating the light emitting device, current spreads well due to high electron mobility of the 2-DEG layer. This current spreading effect reduces operating voltage and elevates light emitting efficiency.

Also, the SiC layer constituting the current spreading layer 330a has dielectric constant higher than that of the n-type clad layers 305, 304. As a result, a layered structure of n-doped $Al_xGa_yIn_{1-x-y}N$/SiC/n-doped $Al_xGa_yIn_{1-x-y}N$ serves as a capacitor. Therefore, such a capacitor accumulates electric charge momentarily when ESD voltage is impressed, thus protecting the light emitting device.

The SiC layer constituting the current spreading layer 330a may be an undoped SiC layer or an n-doped SiC layer. The undoped SiC layer is basically n-type conductive. At least one of N, Ti, Cr and P may be used as dopants added to the n-doped SiC layer.

As shown in FIG. 4, an upper n-type clad layer 305 just underneath an active layer 307 is made of low-concentration n-doped $Al_xGa_yIn_{1-x-y}N$ layer having electron concentration lower than that of a lower n-type clad layer 304. The low-concentration n-doped $Al_xGa_yIn_{1-x-y}N$ layer (upper n-type clad layer 305) is placed just underneath the active layer 307 so that crystalline degradation of the active layer 307 can be prevented. If high-concentration n-doped $Al_xGa_yIn_{(1-x-y)}N$ layer is arranged just underneath the active layer 307, crystalinity of the active layer deteriorates due to dopant impurities.

Preferably, the lower n-type clad layer 304 has electron concentration of about $1 \times 10^{18}$ to $5 \times 10^{18}$ cm$^{-3}$. The upper n-type clad layer 305 has electron concentration lower than that of the lower n-type clad layer 304, but preferably at least $1 \times 10^{16}$ cm$^{-3}$. If the upper n-type clad layer 305 has electron concentration smaller than $1 \times 10^{16}$ cm$^{-3}$, electric resistance becomes too big. Preferably, the upper n-type clad layer 305 has electron concentration of $1 \times 10^{16\ cm^{-3}}$ to $1 \times 10^{18}$ cm$^{-3}$.

FIG. 5 is a partial sectional view illustrating a current spreading layer of a group III-nitride light emitting device according to another embodiment of the invention. In this embodiment, a current spreading layer 330b includes high-concentration n-doped $Al_xGa_yIn_{1-x-y}N$ layers 331, 333 and a SiC layer 332 interposed therebetween. By arranging high-concentration doped $Al_xGa_yIn_{1-x-y}N$ layers 331, 333, current is spread widely and ESD protection capacity is also improved. The SiC layer 332 with high dielectric constant is interleaved between high-concentration n-doped $Al_xGa_yIn_{1-x-y}N$ layers 331, 333 to increase ESD resistance. The embodiment of FIG. 5 indicates greater ESD than that of FIG. 4. This is because high-concentration n-doped $Al_xGa_yIn_{1-x-y}N$ layers 331, 333 sandwiching the SiC layer 332 therebetween can be used as high-quality capacitor electrodes.

FIG. 6 is a partial sectional view illustrating a current spreading layer of a group III-nitride light emitting device according to further another embodiment of the invention. In this embodiment, the current spreading layer 330c includes a plurality of SiC layers 332 and high-concentration n-doped $Al_xGa_yIn_{1-x-y}N$ layers 331 sandwiching the SiC layers 332 therebetween. Repeated stacking of a high-concentration n-doped $Al_xGa_yIn_{1-x-y}N$ layer 331 and a SiC layer 332 allows formation of a greater number of 2-DEG layers. Consequently, current spreading effect is significantly heightened so that properties of operating voltage and useful life of the device are improved. In the embodiment of FIG. 6, the high-concentration n-doped $Al_xGa_yIn_{1-x-y}N$ layer 331, the SiC layer 332, the high-concentration n-doped $Al_xGa_yIn_{1-x-y}N$ layer 331 are stacked one on another to ensure ESD protection effect.

As stated above, according to the invention, the current spreading layer including the SiC layer is interleaved between n-type clad layers to spread current widely and expand light emitting area. This increases useful life, light emitting efficiency and optical output of the light emitting device, while reducing operating voltage and heat generation thereof.

Also, the light emitting device is protected from ESD voltage by inserting a SiC layer with high dielectric constant between the n-doped $Al_xGa_yIn_{1-x-y}N$ layers.

While the present invention has been shown and described in connection with the preferred embodiments, it will be apparent to those skilled in the art that modifications and variations can be made without departing from the spirit and scope of the invention as defined by the appended claims.

What is claimed is:

1. A group III-nitride light emitting device comprising:
   a lower n-type clad layer, a current spreading layer and an upper n-type clad layer formed in their order on a substrate; and
   an active layer and a p-type clad layer formed in their order on the upper n-type clad layer,
   wherein the current spreading layer comprises a SiC layer.

2. The group III-nitride light emitting device according to claim 1, wherein the SiC layer comprises an undoped SiC layer.

3. The group III-nitride light emitting device according to claim 1, wherein the SiC layer comprises an n-doped SiC layer.

4. The group III-nitride light emitting device according to claim 3, wherein a dopant added to the SiC layer comprises one selected from a group consisting of N, Ti, Cr and P.

5. The group III-nitride light emitting device according to claim 1, wherein the current spreading layer further comprises high-concentration n-doped $Al_xGa_yIn_{1-x-y}N$ layers having electron concentration higher than that of the lower n-type clad layer, where $0 \leq x \leq 1$, $0 \leq y \leq 1$, and $0 \leq x+y \leq 1$, and formed on and underneath the SiC layer, respectively.

6. The group III-nitride light emitting device according to claim 5, wherein the current spreading layer further comprises at least one SiC layer on the high-concentration n-doped $Al_xGa_yIn_{1-x-y}N$ layer formed on the SiC layer.

7. The group III-nitride light emitting device according to claim 5, wherein the current spreading layer comprises a multilayer structure including the high-concentration n-doped $Al_xGa_yIn_{1-x-y}N$ layer and the SiC layer stacked repeatedly.

8. The group III-nitride light emitting device according to claim 5, wherein the high-concentration n-doped $Al_xGa_yIn_{1-x-y}N$ layers have electron concentration of $1 \times 10^{21}$ cm$^{-3}$ or less.

9. The group III-nitride light emitting device according to claim 1, wherein the lower n-type clad layer has electron concentration of $1 \times 10^{18}$ to $5 \times 10^{18}$ cm$^{-3}$.

10. The group III-nitride light emitting device according to claim 5, wherein the high-concentration n-doped $Al_xGa_yIn_{1-x-y}N$ layer formed on the SiC layer has a composition identical to the high-concentration n-doped $Al_xGa_yIn_{1-x-y}N$ layer formed underneath the SiC layer.

11. The group III-nitride light emitting device according to claim 5, wherein the high-concentration n-doped $Al_xGa_yIn_{1-x-y}N$ layer formed on the SiC layer has a composition different from the high-concentration n-doped $Al_xGa_yIn_{1-x-y}N$ layer formed underneath the SiC layer.

12. The group III-nitride light emitting device according to claim 1, wherein the upper n-type clad layer comprises a low-concentration n-doped $Al_xGa_yIn_{1-x-y}N$ layer having electron concentration lower than that of the lower n-type clad layer, and formed just underneath the active layer.

13. The group III-nitride light emitting device according to claim 12, wherein the low-concentration n-doped $Al_xGa_yIn_{1-x-y}N$ layer has electron concentration of at least $1 \times 10^{16}$ cm$^{-3}$.

14. The group III-nitride light emitting device according to claim 12, wherein the low-concentration n-doped $Al_xGa_yIn_{1-x-y}N$ layer has electron concentration of $1 \times 10^{16}$ cm$^{-3}$ to $1 \times 10^{18}$ cm$^{-3}$.

15. The group III-nitride light emitting device according to claim 1, wherein the group III-nitride light emitting device is a light emitting diode.

16. The group III-nitride light emitting device according to claim 1, wherein the group III-nitride light emitting device is a laser diode.

* * * * *